US011638352B2

(12) United States Patent
Mak

(10) Patent No.: US 11,638,352 B2
(45) Date of Patent: Apr. 25, 2023

(54) CIRCUIT BOARD HAVING MULTIPLE DEGREES OF FREEDOM AND ANTI-SHAKING MINIATURE ACTUATOR

(71) Applicant: VISTA INNOTECH LIMITED, Hong Kong (HK)

(72) Inventor: Lin Chi Mak, Hong Kong (HK)

(73) Assignee: VISTA INNOTECH LIMITED, Hong Kong (HK)

( * ) Notice: Subject to any disclaimer, the term of this patent is extended or adjusted under 35 U.S.C. 154(b) by 384 days.

(21) Appl. No.: 16/800,590

(22) Filed: Feb. 25, 2020

(65) Prior Publication Data
US 2020/0196447 A1 Jun. 18, 2020

Related U.S. Application Data

(63) Continuation of application No. PCT/CN2017/100963, filed on Sep. 8, 2017.

(30) Foreign Application Priority Data

Aug. 25, 2017 (CN) .......................... 201710747560.7

(51) Int. Cl.
*H05K 1/18* (2006.01)
*H05K 1/11* (2006.01)
*H04N 5/232* (2006.01)

(52) U.S. Cl.
CPC ........... *H05K 1/118* (2013.01); *H04N 5/2328* (2013.01); *H05K 1/189* (2013.01); *H05K 2201/037* (2013.01); *H05K 2201/10151* (2013.01)

(58) Field of Classification Search
CPC .. H05K 1/118; H05K 1/189; H05K 2201/037; H05K 2201/10151; H04N 5/2328
See application file for complete search history.

(56) References Cited

U.S. PATENT DOCUMENTS

2008/0158412 A1* 7/2008 Tagome ............... H04N 5/2253
348/374
2018/0188474 A1* 7/2018 Enta ......................... G02B 7/08

FOREIGN PATENT DOCUMENTS

CN 103905720 A 7/2014
CN 104025564 A 9/2014
(Continued)

OTHER PUBLICATIONS

International Search Report of PCT Patent Application No. PCT/CN2017/100963 dated May 23, 2018.

*Primary Examiner* — Binh B Tran

(57) ABSTRACT

A circuit board having multiple degrees of freedom, comprises a flat board and a conductive and flexible unit disposed on the flat board. The conductive and flexible unit comprises: an inner support plate, an outer support plate, and at least one flexible connector; a hollow portion is provided on the outer support plate; the inner support plate and the flexible connector are disposed in the hollow portion; the inner and the outer support plates are connected by the flexible connector; the flexible connector comprises an outer connecting portion, an inner connecting portion corresponding to the outer connecting portion, and an extension located between the outer connecting portion and the inner connecting portion. The circuit board has a simple and compact structure; the production efficiency is high; costs are low; a multi-axis flexible anti-shaking effect can be achieved without folding a flexible structure; the resilience performance is good.

9 Claims, 10 Drawing Sheets

(56) References Cited

FOREIGN PATENT DOCUMENTS

| CN | 204575939 U | 8/2015 |
| CN | 105025657 A | 11/2015 |
| CN | 102934021 B | 1/2016 |
| CN | 106707659 A | 5/2017 |
| CN | 207867190 U | 9/2018 |

\* cited by examiner

CIRCUIT BOARD HAVING MULTIPLE DEGREES OF FREEDOM AND ANTI-SHAKING MINIATURE ACTUATOR

CROSS REFERENCE TO RELATED APPLICATIONS

The present application is a Continuation Application of PCT Application No. PCT/CN2017/100963 filed on Sep. 8, 2017, which claims the benefit of Chinese Patent Application No. 201710747560.7 filed on Aug. 25, 2017. All the above are hereby incorporated by reference. the contents of which are incorporated herein by reference in their entirety.

FIELD OF THE INVENTION

The invention relates to a circuit board with Multi-Degree-of-Freedom (Multi-DOF) and an anti-shaking miniature actuator.

BACKGROUND OF THE INVENTION

In recent years, small mobile devices with cameras are very popular, and their application scope is expanding, including aerial photography, action cameras, automobile data recorders, and the like. Such an existing device includes at least one compact camera module. As a result, the market for such module is huge with significant growth.

When photos and videos are taken, the photos and videos taken by mobile devices are likely to be blurry or unstable due to outer vibrations, affecting quality of the photos and videos. The problem is more serious when the vibration is more intense, or in low light conditions. In order to solve the problem, many small anti-shaking devices have appeared in the market. Among other, it is most effective to compensate image blur and shake due to vibration by mechanical methods to improve image quality. The mechanical methods may comprise translating a group of lenses through an anti-shaking actuator, or rotating a group of lenses and image sensors, to achieve an anti-shaking effect. The anti-shaking effect of a rotary mechanical method is generally better than that of a translational mechanical method.

Since a rotary anti-shaking actuator needs to move an image sensor during the anti-shake process, the circuit board connected to the image sensor should connect to other external components through a flexible structure which is conductive, so that other external components (e.g., a microcontroller on the motherboard of a small mobile device, and a power supply component) can electrically connect and communicate with the image sensor, and can capture images and provide power.

An image blur correction device is provided in Chinese patent No. 201310706020.6, which comprises: a drive current output unit configured to output a first drive current and a second drive current, the first drive current being used to drive a first correction mechanism which is used for correcting image blurring in a first direction perpendicular to an optical axis, and the second drive current being used to drive a second correction mechanism which is used for correcting image blurring in a second direction perpendicular to the optical axis and the first direction; and a drive current limiting unit configured to limit the first drive current to a first limiting value, limit the second drive current to a second limiting value, and limit a sum of the first drive current and the second drive current to a third limit value which is smaller than a sum of the first limit value and the second limit value, wherein the first limit value is changed by changing the power supply time of the first drive current and the second limit value is changed by changing the power supply time of the second drive current.

An optical unit with a shake correction function is disclosed in Chinese patent No. 201180028200.2. In the optical unit with a shake correction function, permanent magnets are provided at a plurality of locations which are disposed at intervals on the outer peripheral surface of the movable assembly, i.e. the camera unit, in the circumferential direction of the optical axis L, and a sheet-shaped coil integrally having a plurality of coil portions which extend in the circumferential direction and are opposite to the permanent magnets is provided in the fixed body. In the sheet-shaped coil, since the terminal portion faces the outside on the side opposite to the permanent magnets, the coil portions can be easily electrically connected.

The disadvantages of the above technical solution lie in that: the flexible structure in the circuit board needs to be folded, since it is long and needs large space; the overall assembly and the production process are complicated, the production cost is high, and the production efficiency is low.

SUMMARY OF THE INVENTION

Aiming at the aforementioned disadvantages of the prior art, a circuit board with Multi-Degree-of-Freedom (Multi-DOF) and an anti-shaking miniature actuator are provided in the invention, which have features of simple and compact structure, high production efficiency, and low cost. In addition, it is not necessary to fold the flexible structure to achieve multi-axis flexible anti-shaking effect, and the drop resistance is good.

In order to achieve the aforementioned objective, in one aspect, a circuit board with Multi-Degree-of-Freedom (Multi-DOF) is provided in the invention, which comprises a flat board and a conductive and flexible unit located on the flat board, wherein the conductive and flexible unit comprises an outer carrier plate, an inner carrier plate and at least one flexible connector;

the outer carrier plate is provided with a hollow portion, and the inner carrier plate and the flexible connector are located in the hollow portion, and the inner carrier plate and the outer carrier plate are connected to each other by the flexible connector;

the flexible connector comprises an outer connecting portion, an inner connecting portion corresponding to the outer connecting portion, and an extension arranged between the outer connecting portion and the inner connecting portion; the extension has an outer end and an inner end; one end of the outer connecting portion is connected to the outer carrier plate, and the other end of the outer connecting portion is connected to the outer end of the extension; and one end of the inner connecting portion is connected to the inner carrier plate, and the other end of the inner connecting portion is connected to the inner end of the extension.

In the invention, the inner carrier plate and the outer carrier plate are connected to each other through the flexible connector, the extension is provided in the hollow portion, and it is not needed to fold the extension, such that the entire structure is located on a flat board, and the structure is simple and convenient to implement. The interaction among a plurality of flexible connectors result in good multi-axial flexibility.

In the invention, when the outer carrier plate is fixed and the inner carrier plate is movable, the movable component is guaranteed to have multi-degree-of-freedom movement by providing a flexible portion, and has good fall resistance.

According to another specific embodiment of the invention, the extension comprises at least a first linkage arm, a second linkage arm, and a bending portion; the first linkage arm and the second linkage arm are connected to each other by the bending portion. The bending portion may be a regular bending portion such as an arc-shaped bending portion, or may be in other shapes depending on actual conditions. In this solution, the extension comprises but is not limited to, two linkage arms, and a bending portion is provided between two adjacent linkage arms. For example, the extension further comprises a third linkage arm, and a bending portion is provided between the second linkage arm and the third linkage arm.

According to another specific embodiment of the invention, an intersection angle is provided between a first centreline of the first linkage arm and a second centreline of the second linkage arm, and the intersection angle is in a range from 45° to 135°. In this solution, the centreline refers to a line passing through center points of cross sections of two ends of a linkage arm. Through a plurality of linkage arms, the entire flexible connector can be easily deformed in a direction parallel to the centerline of a linkage arm, and the flexible connector has multiple degrees of freedom. The intersection angle can be varied according to cooperation.

According to another specific embodiment of the invention, the intersection angle is 90°, and the first linkage arm and the second linkage arm are arranged to be perpendicular to each other.

According to another specific embodiment of the invention, the first linkage arm and the second linkage arm are each a wave-shaped linkage arm.

According to another specific embodiment of the invention, the first linkage arm and the second linkage arm are each a rod-shaped linkage arm.

According to another specific embodiment of the invention, there are 3 to 8 flexible connectors and the flexible connectors are arranged at intervals between the inner carrier plate and the outer carrier plate. Preferably, there are four flexible connectors which are uniformly distributed in the hollow portion.

According to another specific embodiment of the invention, the outer carrier plate and the inner carrier plate are each provided with a positioning member for facilitating installation, for example, a positioning slot, a threaded hole, a bolt hole, or the like.

According to another specific embodiment of the invention, a position of the outer carrier plate corresponding to the outer connecting portion and a position of the inner carrier plate corresponding to the inner connecting portion are each provided with a rounded corner or a chamfer. By setting a rounded corner or a chamfer, it is convenient to connect the flexible connector to the outer carrier plate and the inner carrier plate, so as to achieve better anti-shaking effect.

In the invention, the maximum distance Dmax between the centerline of a linkage arm and the edge of the linkage arm is smaller than the overall length of the linkage arm, and can be adjusted according to different use conditions.

In another aspect, an anti-shaking miniature actuator is provided in the invention, which comprises: a housing, a positioning base, a magnet group, a spring system, a lens, a lens holder, an image sensor, and a coil group; the positioning base is located on the housing, the magnet group is located on the housing, the lens holder is disposed on the positioning base, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

In the invention, the housing, the positioning base, the magnet group, and the outer carrier plate of the circuit board form a fixed structure outside the actuator. The spring system, the lens and the lens holder, the image sensor, the coil group, and the inner carrier plate of the circuit board form a movable structure. By changing the current and direction of the coil group, the magnetic torques of the multi-axis rotation degrees of freedom can be adjusted, so that the movable structure can rotate around the rotation center in the spring system, and the position of the rotation center will not be displaced during movement. When the rotation of the movable assembly relative to the fixing assembly has an opposite direction to the outer rotation and vibration, but has a similar amplitude to the outer rotation and vibration, the vibration will be eliminated to achieve a multi-axis anti-shaking effect and reduce the impact of vibration on video and image quality.

In the invention, the image sensor is connected to external components through a circuit board, such as a single-chip microcomputer on a motherboard of a small mobile device, so that the electric connection between the image sensor and the single-chip microcomputer is realized so as to obtain images and provide power.

In the invention, the circuit board with the conductive and flexible unit realizes the multi-degree-of-freedom movement of the movable structure, so that the circuit board will not hinder the movement of the movable structure in the anti-shaking process. The circuit board withstands strong multi-axis motions that may occur in a dropping process, and has good drop resistance. The flexible connectors will not be permanently deformed, which effectively improves the reliability of the actuator.

The advantages of the invention lie in that:

1. It is not necessary to fold the flexible connectors of the circuit board, realizing the multi-degree-of-freedom of the movable structure;

2. The circuit board has good drop resistance, and increases reliability in dropping;

3. The circuit board is designed integrally in a plane, and is not needed to be folded, so that its structure is simple and the cost is low; and 4. The size and structure of the anti-shaking miniature actuator are simplified, and the cost is reduced.

The invention will be further described in detail below with reference to drawings.

DETAILED DESCRIPTION OF PREFERRED EMBODIMENTS

Embodiment 1 (A Circuit Board)

Figure 1:
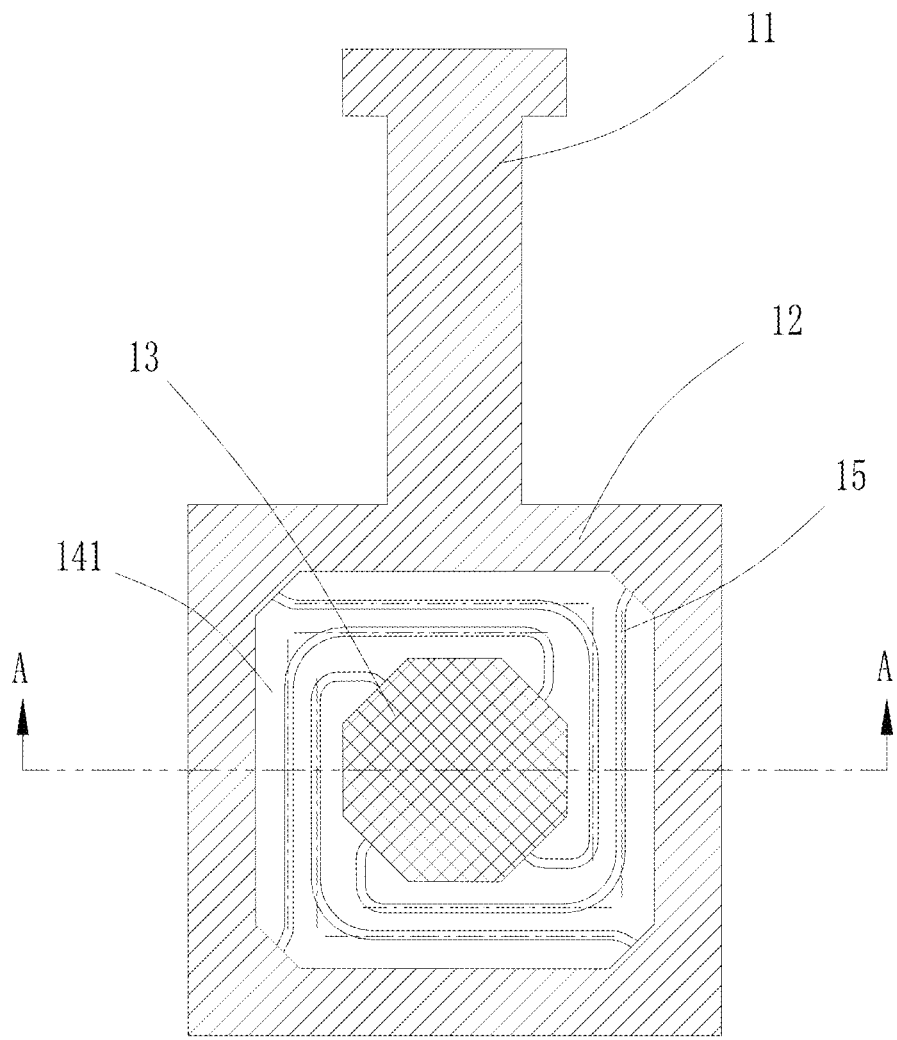
FIG. 1 is a schematic diagram of the overall structure of a circuit board with multi-degree-of-freedom according to Embodiment 1.
Figure 2:
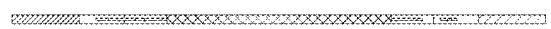
FIG. 2 is a schematic diagram of the circuit board with multi-degree-of-freedom according to Embodiment 1, which shows a cross section A-A.

A circuit board with multi-degree-of-freedom is provided in the embodiment. As shown in FIGS. 1 to 4, the circuit board with multi-degree-of-freedom comprises a flat board 11, and a conductive and flexible unit 12 located on the flat board 11; wherein the conductive and flexible unit 12 comprises an outer carrier plate 13, an inner carrier plate 14, and flexible connectors 15.

Wherein, the outer carrier plate 14 is provided with a hollow portion 141, and the inner carrier plate 13 and the flexible connectors 15 are located in the hollow portion 141. The outer carrier plate 14 and the inner carrier plate 13 are connected to each other by the flexible connectors 15. The inner carrier plate 13 is surrounded by the outer carrier plate 14 on the flat board 11.

There are four flexible connectors 15, and each of the flexible connectors 15 comprises an outer connecting portion 151, an inner connecting portion 152 corresponding to the connecting portion 151, and an extension 153 arranged between the outer connecting portion 151 and the inner connecting portion 152. The extension 153 has an outer end and an inner end. One end of the outer connecting portion 151 is connected to the outer carrier plate 14, and the other end of the outer connecting portion 151 is connected to the outer end of the extension 153; and one end of the inner connecting portion 152 is connected to the inner carrier plate 13, and the other end of the inner connecting portion 152 is connected to the inner end of the extension 153.

The extension 153 comprises a first linkage arm 154, a second linkage arm 155, and a bending portion 156. The first linkage arm 154 and the second linkage arm 155 are connected to each other by the bending portion 156. The first linkage arm 154 and the second linkage arm 155 are each a rod-shaped linkage arm. The bending portion 156 is in an arc shape. An intersection angle is provided between a first centreline 157 of the first linkage arm 154 and a second centreline 158 of the second linkage arm 155, and the intersection angle is 90°.

In the embodiment, the maximum distance Dmax between a centerline of a linkage arm and the edge of the linkage arm is much smaller than the overall length of the linkage arm, and can be adjusted according to different use conditions.

In the embodiment, the outer carrier plate 14 is in a square shape with four edges. A chamfer 142 is provided between two adjacent edges, and the outer connecting portion 151 is connected to the position of the chamfer 142 to facilitate production. The inner carrier plate 13 is a regular octagon. The inner connecting portion 152 is connected to one edges of the regular octagon, and is vertically connected to the inner carrier plate 13.

Figure 3:
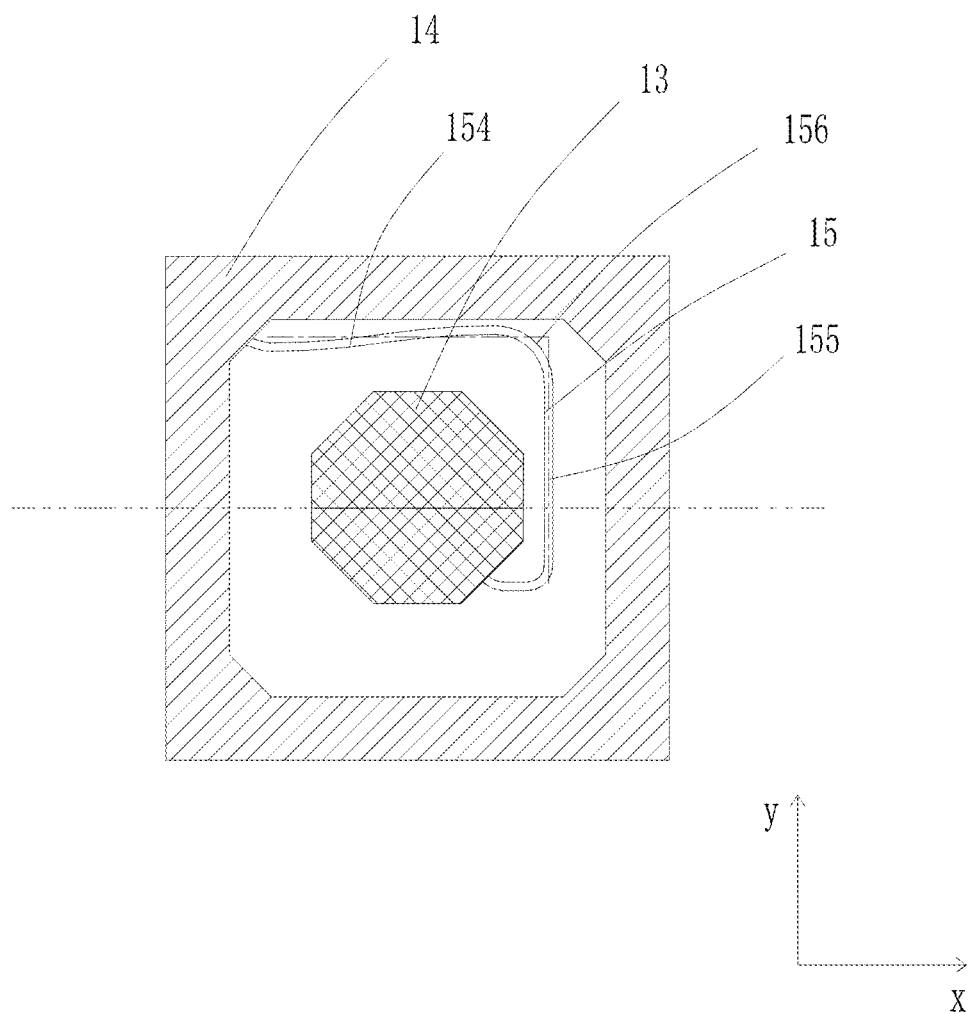
FIG. 3 is a schematic diagram of a conductive and flexible unit of the circuit board with multi-degree-of-freedom according to Embodiment 1, which shows a stress state.

As shown in FIG. 3, the flexible connectors 15 are disposed at intervals in the hollow portion 141. The first linkage arm 154 and the second linkage arm 155 are disposed to be perpendicular to each other, which realizes the multi-degree-of-freedom of the inner carrier plate 13 and provides flexibility and deformation required when the inner carrier plate 13 moves. The outer carrier plate 14 is fixed, and when the inner carrier plate 13 moves in the y(+) direction (that is, the moving direction is perpendicular to the first centerline 157, but parallel to the second centerline 158), bending deformation may occur in the first linkage arm 154, while substantially no bending deformation occurs in the second linkage arm 155. In other words, the first linkage arm 154 can provide the flexibility and deformation required when the inner carrier plate 13 moves in the y(+) direction.

Figure 4:
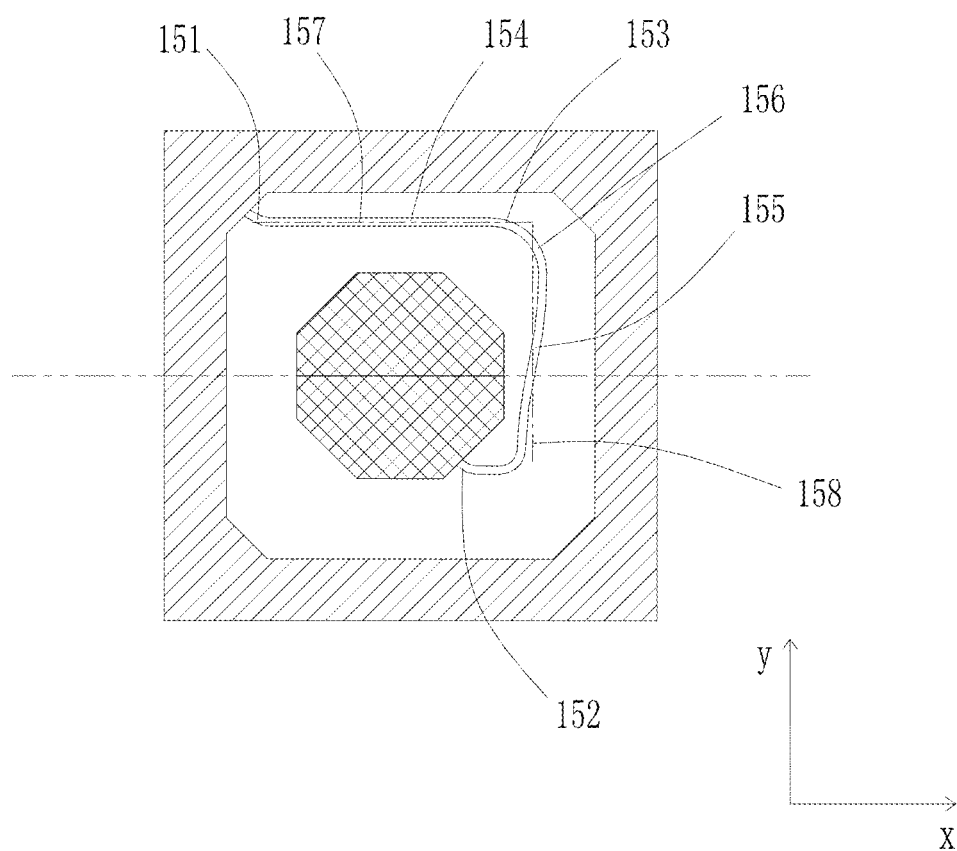
FIG. 4 is a schematic diagram of a conductive and flexible unit of the circuit board with multi-degree-of-freedom according to Embodiment 1, which shows another stress state.

As shown in FIG. 4, the outer carrier plate 14 is fixed, and when the inner carrier plate 13 moves in the x(−) direction (that is, the moving direction is perpendicular to the second centerline 158, but parallel to the first center line 157), bending deformation may occur in the second linkage arm 155, while substantially no bending deformation occurs in the first linkage arm 154. In other words, the second linkage arm 155 can provide the flexibility and deformation required when the inner carrier plate 13 moves in the x(−) direction.

The circuit board provided in the embodiment enables multi-degree-of-freedom movement of the inner carrier plate. It is not necessary to fold the flexible connectors of the circuit board, realizing the multi-axis degree of freedom of the movable structure. The circuit board is designed integrally in a plane, and is not needed to be folded, so that its structure is simple and the cost is low.

Embodiment 2 (A Circuit Board)

Figure 5:
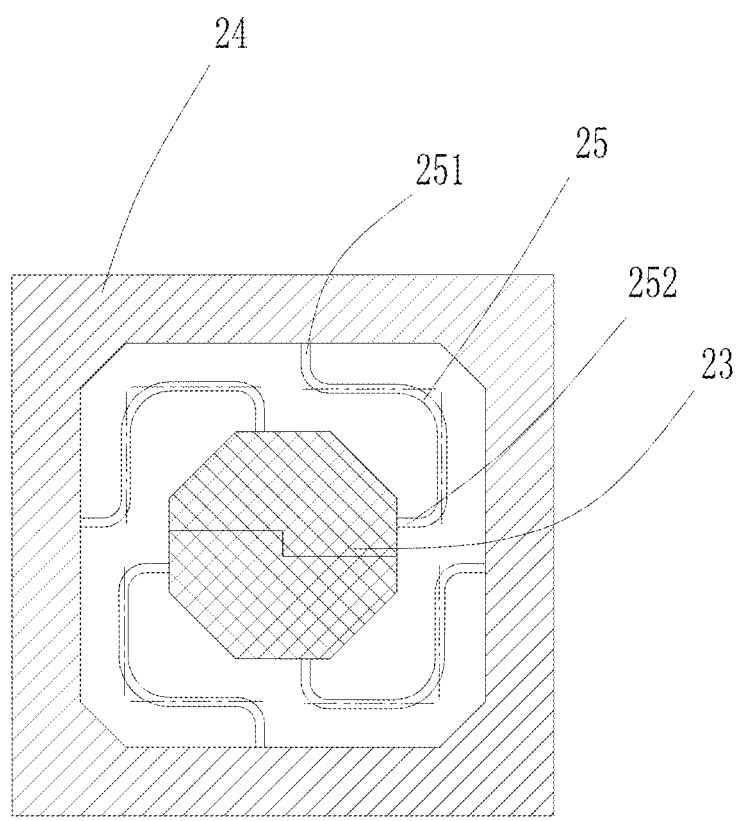
FIG. 5 is a schematic structural diagram of a conductive and flexible unit of a circuit board with multi-degree-of-freedom according to Embodiment 2.

As shown in FIG. 5, the differences between this embodiment and Embodiment 1 lie in that: each of the flexible connector 25 has a different shape; the connection positions between the flexible connector 25 and the inner carrier plate 23, and between the flexible connector 25 the outer carrier plate 24 are different; the outer connecting portion 251 is vertically connected to a center portion of one side of the outer carrier plate 24, and the inner connecting portion 252 is vertically connected to one side of the inner carrier plate 23; and the outer connecting portion 251 is disposed to be perpendicular to the inner connecting portion 252.

Embodiment 3 (A Circuit Board)

Figure 6:
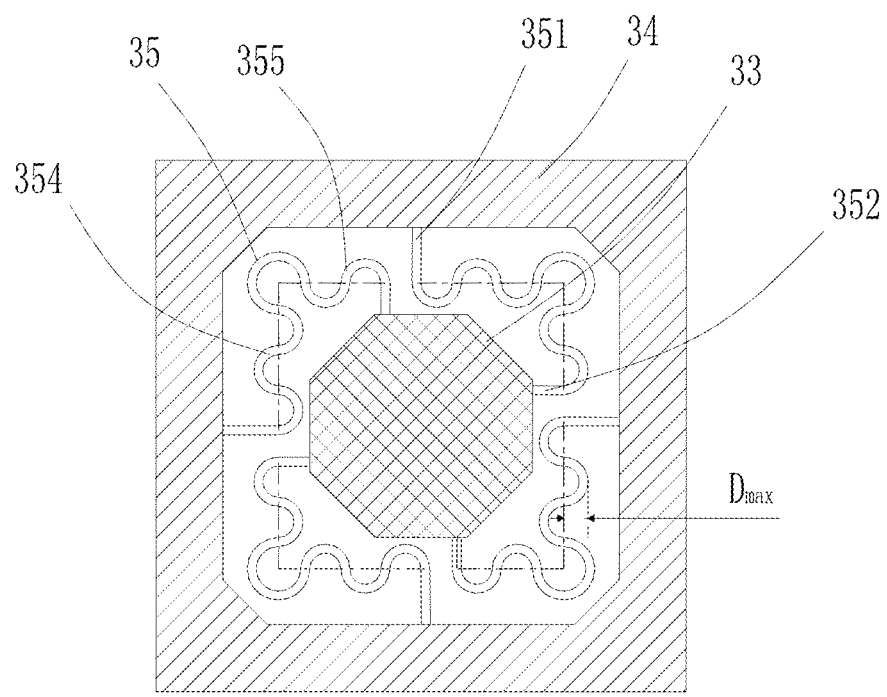
FIG. 6 is a schematic structural diagram of a conductive and flexible unit of a circuit board with multi-degree-of-freedom according to Embodiment 3.

As shown in FIG. 6, the differences between this embodiment and Embodiment 1 lie in that: each of the flexible connector 35 has a different shape; the connection positions between the flexible connector 35 and the inner carrier plate 33, and between the flexible connector 35 the outer carrier plate 34 are different; in the flexible connector 35, the first linkage arm 354 and the second linkage arm 355 are wave-shaped, and wave-shaped protrusions are arranged in a direction parallel to a plane of the inner carrier plate 33 and the outer carrier plate 34; and the outer connecting portion 351 is vertically connected to a center portion of one side of the outer carrier plate 34, and the inner connecting portion 352 is vertically connected to one side of the inner carrier plate 33; and the outer connecting portion 351 is disposed to be perpendicular to the inner connecting portion 352.

In the embodiment, the maximum distance Dmax between the centerline of a linkage arm and the edge of the linkage arm is smaller than the overall length of the linkage arm, and can be adjusted according to different use conditions.

Embodiment 4 (A Circuit Board)

Figure 7:
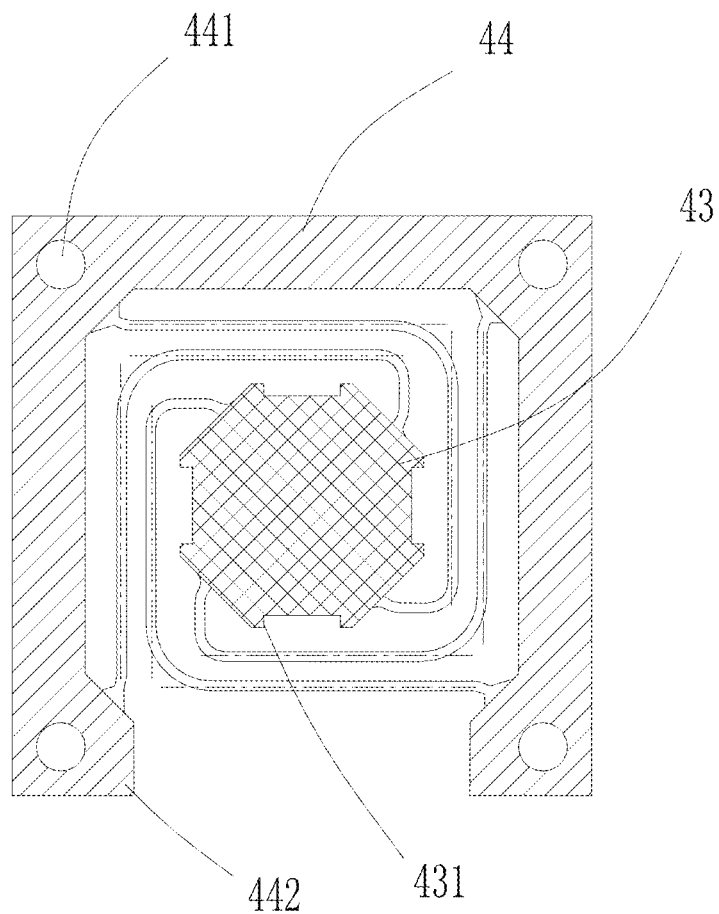
FIG. 7 is a schematic structural diagram of a conductive and flexible unit of a circuit board with multi-degree-of-freedom according to Embodiment 3.
Figure 8:
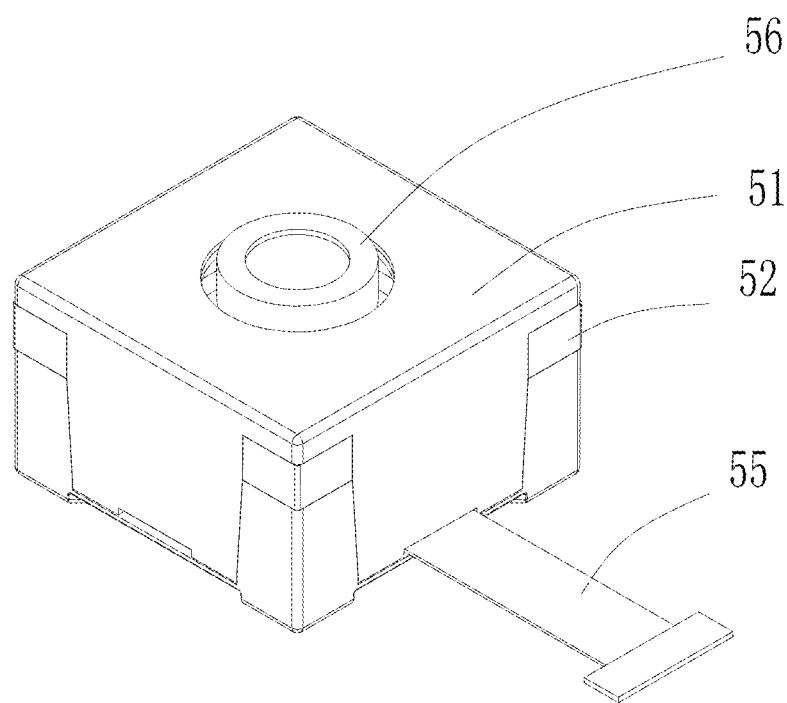
FIG. 8 is a schematic diagram of the overall structure of an anti-shaking miniature actuator according to Embodiment 5.
Figure 9:
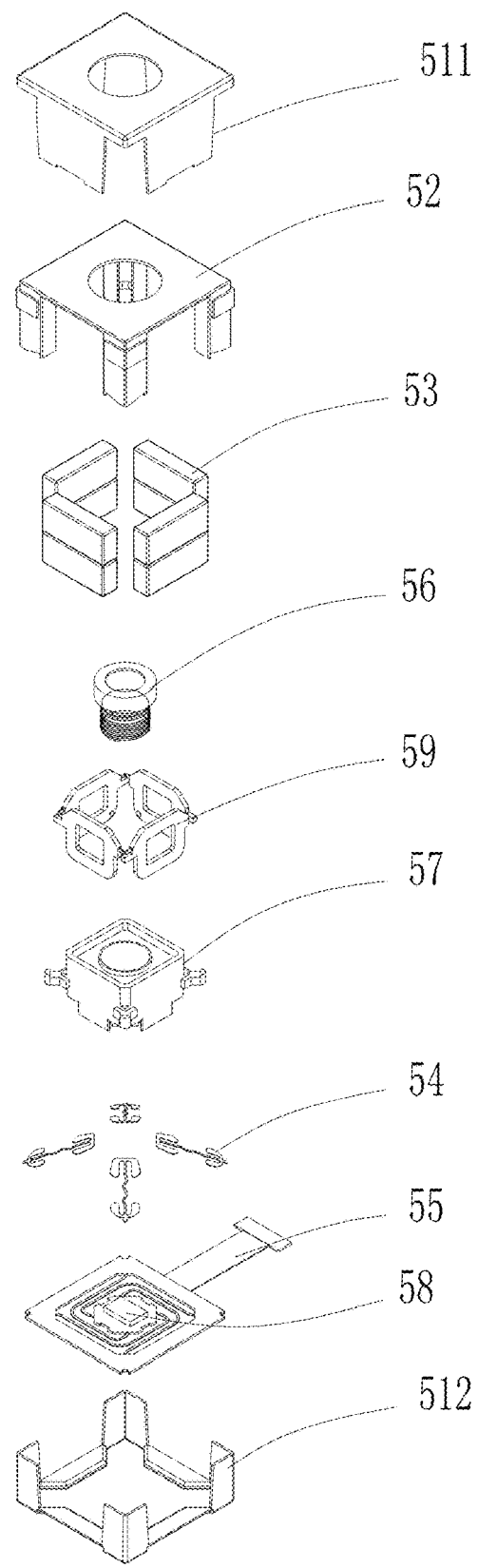
FIG. 9 is an exploded schematic diagram of the anti-shaking miniature actuator according to Embodiment 5.

As shown in FIG. 7, the differences between this embodiment and Embodiment 1 lie in that: the outer carrier plate 44 is provided with bolt holes 441 for installation and positioning, and one edge of the outer carrier plate 44 is provided with a slot 442 for connection or positioning; and non-adjacent edges of the inner carrier plate 43 are provided with position-limiting slots 431 which are convenient for installation and use of the circuit board.

Embodiment 5 (An Anti-Shaking Miniature Actuator)

An anti-shaking miniature actuator is provided in the embodiment. As shown in FIGS. 8 to 11, the anti-shaking miniature actuator comprises a housing 51, a positioning base 52, a magnet group 53, a spring system 54, a circuit board 55 with a conductive and flexible unit, a lens 56, a lens holder 57, an image sensor 58, and a coil group 59. The housing 51 comprises an upper housing 511 and a lower housing 512. The positioning base 52 is located on the housing 51, the magnet group 53 is located on the housing 51, the lens holder 57 is disposed on the positioning base 52, the coil group 59 is disposed outside of the lens holder 57 corresponding to the magnet group 53, and the lens 56 is disposed on the lens holder 57. An outer carrier plate of the conductive and flexible unit is installed on the positioning base 52, and the image sensor 58 is disposed on an inner carrier plate of the conductive and flexible unit.

Figure 10:
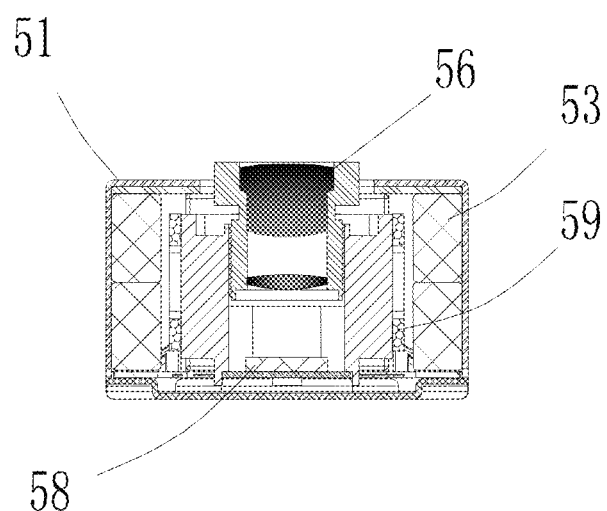
FIG. 10 is a schematic diagram of a state of the anti-shaking miniature actuator of Embodiment 5.
Figure 11:
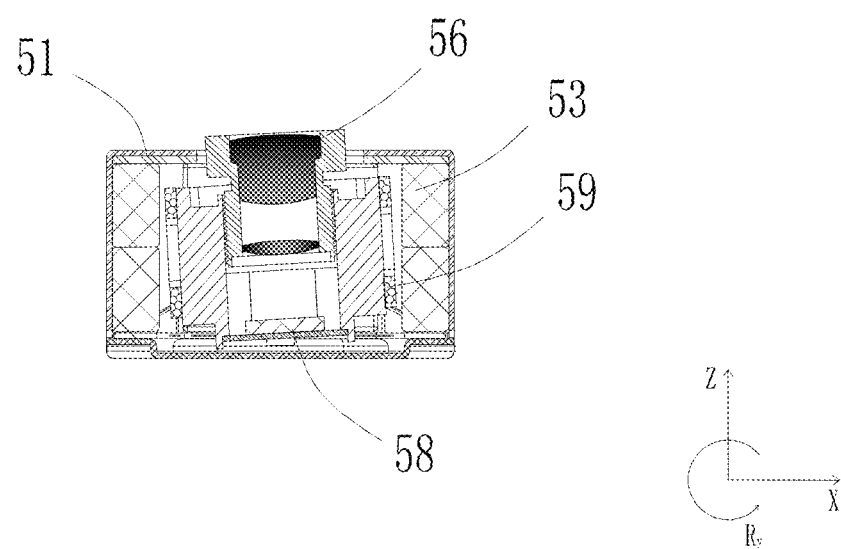
FIG. 11 is a schematic diagram of the anti-shaking miniature actuator of Embodiment 5 when a force is applied.

As shown in FIGS. 10 to 11, by changing the current and direction of the coil group, the magnetic torques of the multi-axis rotation degree of freedom can be adjusted, so that the movable structure (including the lens, the image sensor, and the like) can rotate around the rotation center in the spring system, and the position of the rotation center will not be displaced during movement. When the rotation of the movable assembly relative to the fixing assembly has an opposite direction to the outer rotation and vibration, but has a similar amplitude to the outer rotation and vibration, the vibration will be eliminated to achieve a multi-axis anti-shaking effect and reduce the impact of vibration on video and image quality.

In the embodiment, when the movable components rotate, the inner carrier plate also rotates. At this time, the outer carrier plate is fixed, and the flexible connector of the conductive and flexible unit on the circuit board is deformed to meet needs of rotation, thereby realizing multi-degree-of-freedom movement of the movable components and achieving a good anti-shaking effect. The entire structure has good drop resistance and increases reliability in dropping.

Although the invention is disclosed as above with the preferred embodiments, it is not intended to limit the scope of the invention. Any ordinary person skilled in the art can make some improvements without departing from the scope of the invention, that is, any equivalent improvement made in accordance with the invention should fall within the scope of the invention.

What is claimed is:

1. An anti-shaking miniature actuator comprising a circuit board with Multi-DOF, the circuit board comprises a flat board and a conductive and flexible unit located on a same flat plane, the conductive and flexible unit comprises an outer carrier plate, an inner carrier plate, and at least one flexible connector; the outer carrier plate is provided with a hollow portion, the inner carrier plate and the flexible connector are located in the hollow portion, and the inner carrier plate and the outer carrier plate are connected to each other by the flexible connector, the flexible connector comprises an outer connecting portion, an inner connecting portion corresponding to the outer connecting portion, and an extension arranged between the outer connecting portion and the inner connecting portion, the extension has an outer end and an inner end, one end of the outer connecting portion is connected to the outer carrier plate, and the other end of the outer connecting portion is connected to the outer end of the extension, one end of the inner connecting portion is connected to the inner carrier plate, and the other end of the inner connecting portion is connected to the inner end of the extension;

wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

2. An anti-shaking miniature actuator comprising a circuit board with Multi-DOF according to claim 1, wherein the extension comprises a first linkage arm, a second linkage arm, and a bending portion; the first linkage arm and the second linkage arm are connected to each other through the bending portion, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

3. An anti-shaking miniature actuator comprising a circuit board with Multi-DOF according to claim 2, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

4. An anti-shaking miniature actuator comprising a circuit board with Multi-DOF according to claim 3, wherein the intersection angle is 90°, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

5. An anti-shaking miniature actuator comprising a circuit board with Multi-DOF according to claim 2, wherein the first linkage arm and the second linkage arm are each a wave-shaped linkage arm, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

6. An anti-shaking miniature actuator comprising a circuit board with Multi-DOF according to claim 2, wherein the first linkage arm and the second linkage arm are each a rod-shaped linkage arm, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

7. An anti-shaking miniature actuator comprising a circuit board with Multi-DOF according to claim 1, wherein there are 3 to 8 flexible connectors, and the flexible connectors are arranged at intervals between the inner carrier plate and the outer carrier plate, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

8. An anti-shaking miniature actuator comprising a circuit board with Multi-DOF according to claim 1, wherein the outer carrier plate and the inner carrier plate are each provided with a positioning member for facilitating installation, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

9. An anti-shaking miniature actuator comprising a circuit board with Multi-DOF according to claim 1, wherein a position of the outer carrier plate corresponding to the outer connecting portion and a position of the inner carrier plate corresponding to the inner connecting portion are each provided with a rounded corner or a chamfer, wherein the anti-shaking miniature actuator further comprises a housing, a positioning base, a magnet group, a spring system, a lens, a lens holder, an image sensor, and a coil group; the positioning base is located on the housing, the magnet group is located on the housing, the lens holder is disposed on the positioning base through the spring system, the coil group is disposed outside of the lens holder corresponding to the magnet group; the lens is disposed on the lens holder; an outer carrier plate of a conductive and flexible unit is installed on the positioning base, and the image sensor is disposed on an inner carrier plate of the conductive and flexible unit.

\* \* \* \* \*